(12) United States Patent
Suzuki (10) Patent No.: US 7,537,868 B2
(45) Date of Patent: May 26, 2009

(54) METHOD OF MANUFACTURING COLOR FILTERS

(75) Inventor: Hisashi Suzuki, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/052,433

(22) Filed: Mar. 20, 2008

(65) Prior Publication Data
US 2008/0233492 A1    Sep. 25, 2008

(30) Foreign Application Priority Data
Mar. 23, 2007    (JP) .............................. 2007-077718

(51) Int. Cl.
G02B 5/20    (2006.01)
(52) U.S. Cl. ................. 430/7; 216/24; 216/72
(58) Field of Classification Search ........................ None
See application file for complete search history.

(56) References Cited

U.S. PATENT DOCUMENTS

| | | | |
|---|---|---|---|
| 5,059,500 A * | 10/1991 | Needham et al. ............... | 430/7 |
| 5,336,367 A * | 8/1994 | Nomura ........................ | 438/70 |
| 5,510,215 A * | 4/1996 | Prince et al. .................... | 430/7 |
| 5,756,239 A * | 5/1998 | Wake .............................. | 430/7 |
| 5,847,015 A | 12/1998 | Tajima et al. | |
| 2008/0053953 A1* | 3/2008 | Yoshibayashi ............... | 216/24 |

FOREIGN PATENT DOCUMENTS

| | | |
|---|---|---|
| EP | 0 371 398 B1 | 6/1990 |
| EP | 0 564 168 B1 | 10/1993 |
| EP | 0 645 678 B1 | 3/1995 |
| JP | 55-146406 A | 11/1980 |
| JP | 2-181704 A | 7/1990 |
| JP | 2-199403 A | 8/1990 |
| JP | 5-273411 A | 10/1993 |
| JP | 7-140654 A | 6/1995 |
| JP | 2001-249218 A | 9/2001 |
| JP | 2003-332310 A | 11/2003 |
| JP | 2005-326453 A | 11/2005 |

* cited by examiner

*Primary Examiner*—John A. McPherson
(74) *Attorney, Agent, or Firm*—Birch, Stewart, Kolasch & Birch, LLP (57) ABSTRACT

The present invention provides a method of manufacturing color filters using a first mixed gas and a second mixed gas. In the method, a stopper layer whose etching rate by the second mixed gas is low is formed on the support, a colored layer is formed on the stopper layer, a photo resist layer is formed on the colored layer, an image on the colored layer is formed by removing the photo resist layer according to a pattern, a part of the colored layer is removed by dry etching process using the first mixed gas to the extent that the stopper layer is not exposed removing so as to form a colored-layer removed portion according to the pattern, and the colored-layer removed portion is removed by dry etching process using the second mixed gas so as to form a stopper-layer exposed portion according to the pattern.

20 Claims, 2 Drawing Sheets

METHOD OF MANUFACTURING COLOR FILTERS

BACKGROUND OF THE INVENTION

1. Field of the Invention

The present invention relates to a color filter manufacturing method using dry etching process.

2. Description of the Related Art

Dyeing, printing, electrodeposition and pigment dispersion methods have been known as methods for fabricating color filters for use in liquid crystal display devices or solid-state image sensors.

Of these methods, pigment dispersion method is to fabricate color filters by photolithography process using a radiation sensitive colored composition which is prepared by dispersing a pigment in one of various types of photosensitive compositions. This method offers the advantage of having good stability to light and heat because it uses a pigment. Furthermore, the method ensures high positioning accuracy because it employs photolithography process for patterning; therefore, it has been widely used as a suitable method for fabricating color filters for use in large-size and high-definition color displays.

In the case that a pigment dispersion method is employed for color filter fabrication, color filters can be obtained by: first applying a radiation sensitive composition onto a glass substrate with a spin coater or roll coater, followed by drying to form a film on the glass substrate; second subjecting the formed film to pattern exposure/development to form colored pixels; and repeating these operations for each color.

There are described in some documents examples of the foregoing types of pigment dispersion method which uses a negative-type photosensitive composition prepared using an alkali-soluble resin together with a photopolymerizable monomer and a photopolymerization initiator (e.g. Japanese Patent Application Laid-Open Nos. 2-181704, 2-199403, 5-273411 and 7-140654).

To cope with the demands for higher-quality images of color filters, which cannot be realized with the foregoing negative-type photosensitive composition, there are described in some documents another type of pigment dispersion method which aims at providing color filters whose pixels have been controlled to have desired size and shape and uses a negative-type photosensitive composition prepared using, as an alkali-soluble resin, an acrylic resin having per molecule an alkylene oxide chain and/or hydroxyethyl methacrylate (HEMA)(e.g. Japanese Patent Application Laid-Open No. 2005-326453).

In the mean time, color filters for use in solid-state image sensors have recently been desired to have higher definition. In solid-state image sensors, fine size-reduction is noticeable, and high-resolution technology capable of providing resolution less than 2.0 μm in size has been needed; thus, the resolving power of current photolithography almost reaches its limits.

Besides the foregoing color filter fabricating methods, which use photolithography process, there are color filter fabricating methods using dry etching process, which has been long known as an effective process for forming a thinner and fine pattern. Dry etching process has been conventionally employed as a process for forming a pattern on a vapor-deposited thin film of a pigment (e.g. Japanese Patent Application Laid-Open No. 55-146406). The process is capable of forming a thin film whose thickness is half or less of that of the thin film formed by photolithography process while keeping the spectral characteristics of the thin film almost the same as those of the thin film formed by photolithography process. There are also proposed pattern forming methods which use photolithography process and dry etching process in combination (e.g. Japanese Patent Application Laid-Open No. 2001-249218). Furthermore, there are proposed techniques for making photoresist stripping easy in which the damage surface layer, caused by etching, of photo resist is removed by ashing (e.g. Japanese Patent Application Laid-Open No. 2003-332310).

In manufacturing of color filters using dry etching process, usually the problem of support damage (shaving) caused by over-etching treatment tends to occur. For example, when intending to form a pattern by removing the colored layer on a support by dry etching, part of the support in the area where the colored layer has been removed is sometimes shaved, thereby causing unevenness on the support. Or, over-etching treatment is sometimes carried out after detecting the end point of etching to remove residues on a support, in that case, when an organic film exists on the support or etching gas containing fluorine-based gas is used, it is difficult to avoid the occurrence of support damage.

SUMMARY OF THE INVENTION

The present invention has been made in light of the foregoing problems. Accordingly, the object of the present invention is to provide a color filter manufacturing method which is capable of retarding the occurrence of support damage (shaving) during dry etching treatment. And the subject of the same is to achieve the above object.

To achieve the above object, according to an aspect of the present invention, a method of manufacturing color filters using a first mixed gas, which contains a fluorine-based gas and oxygen gas, and a second mixed gas, which contains nitrogen gas and oxygen gas, comprises: a stopper layer forming step of forming, on a support, a stopper layer whose etching rate by the second mixed gas is low; a colored layer forming step of forming a colored layer on the stopper layer; a photo resist layer forming step of forming a photo resist layer on the colored layer; an image forming step of forming an image on the colored layer by removing the photo resist layer according to a pattern; a first etching step of removing, by dry etching process using the first mixed gas, part of the colored layer to the extent that the stopper layer is not exposed so as to form a colored-layer removed portion according to the pattern having been formed in the image forming step; a second etching step of removing, after the first etching step, the colored-layer removed portion by dry etching process using the second mixed gas so as to form a stopper-layer exposed portion according to the pattern; and a photo resist layer removing step of removing the photo resist layer remaining after the second etching step.

According to the aspect of the present invention, a stopper layer is formed on any one of various types of glass substrates, a silicon substrate, or a support consisting of various types of intermediate layers on a substrate all of which are used in liquid crystal display devices or solid-state image sensors in which a color filter is to be used. For the stopper layer, used is a material whose etching rate by a second mixed gas is low. The second mixed gas, which contains nitrogen gas and oxygen gas, and a first mixed gas, which contains fluorine-based gas and oxygen gas, are used in the color filter manufacturing.

After forming a stopper layer, a colored layer is formed on the stopper layer and a photo resist layer is formed on the colored layer. The formed photo resist layer is subjected to exposure so that it is removed according to a pattern.

After removing the photo resist layer to the pattern, a part of the colored layer is removed by dry etching process using the first mixed gas until the stopper layer is exposed, whereby a colored-layer removed portion is formed according to the pattern.

After the dry etching using the first mixed gas, the colored-layer removed portion is removed by dry etching process using the second mixed gas, whereby the stopper layer is exposed according to the pattern and a stopper-layer exposed portion is formed.

In this dry etching, the stopper layer is etched only slightly because the etching rate of the stopper layer by the second mixed gas is low, and therefore, damage is not caused to the substrate, which is located under the stopper layer. Thus, a color filter with its support free from damage and having good rectangularity is fabricated.

After etching using the second mixed gas, the photo resist layer is stripped. If a colored layer, which is different from the colored layer having been formed on the stopper-layer exposed portion, is formed after the stripping of the photo resist layer, a two-color color filter is fabricated. Furthermore, if a photo resist layer is formed on the two-color color filter and the operations of removing the photo resist to a pattern and etching are repeated just as done in the aspect of the present invention, a multi-color color filter is fabricated.

As described so far, the present invention provides a color filter manufacturing method which is capable of retarding the occurrence of support damage during dry etching treatment.

DETAILED DESCRIPTION OF THE PREFERRED EMBODIMENTS

In the following the preferred embodiments of the color filter manufacturing method of the present invention will be described in detail with reference to the accompanying drawings.

Figure 1:
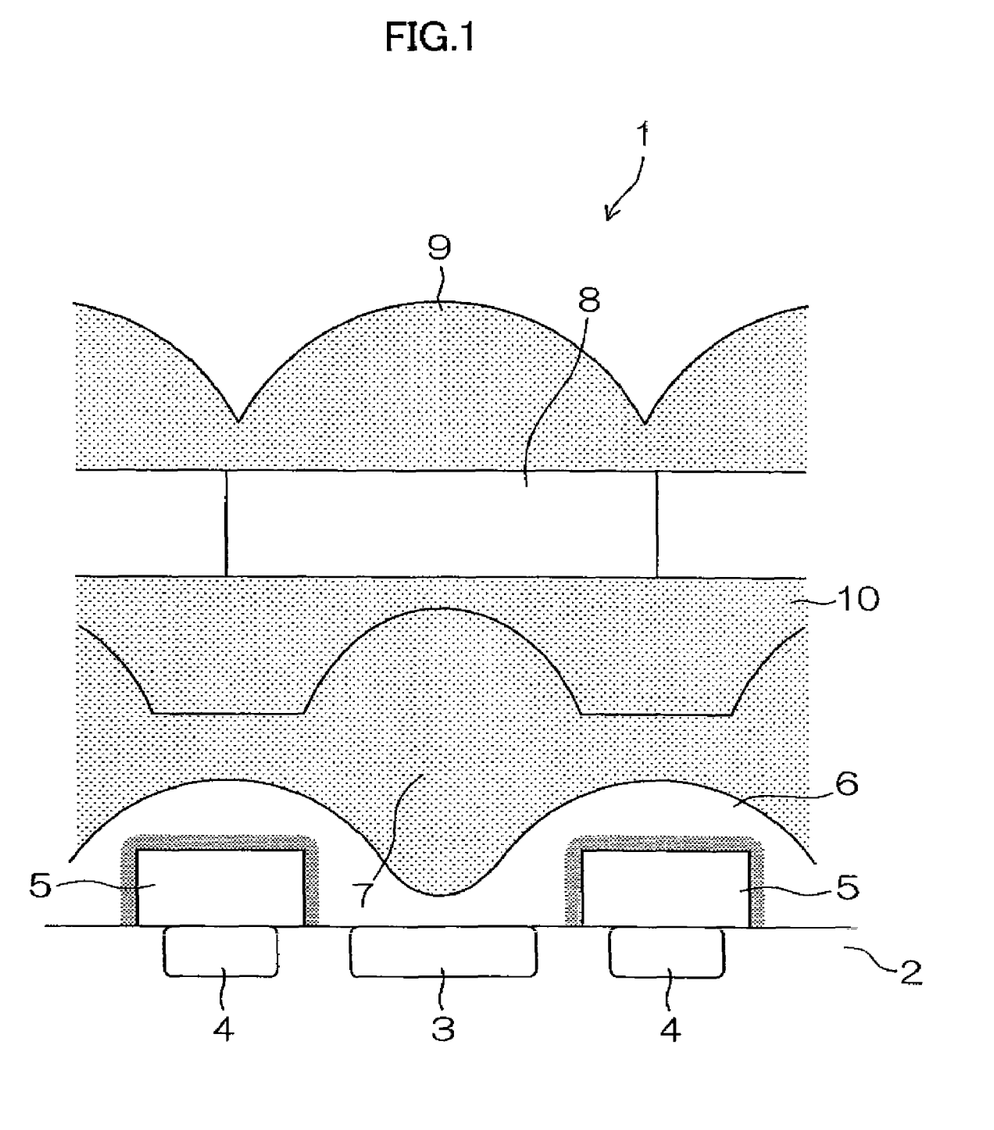
FIG. 1 is a cross-sectional view of a solid-state image sensor in which a color filter according to embodiments of the present invention is used.

First, one example of solid-state image sensors in which a color filter fabricated by the color filter manufacturing method of the present invention will be shown. FIG. 1 is a cross-sectional view of a solid-state image sensor.

In solid-state imaging device 1, n-type solid-state image sensors 3 and n-type transfer channels 4 are formed on the surface of semiconductor substrate 2 in which p-type well layer is formed on an n-type substrate. Above transfer channels 4, transfer electrodes 5 are formed via an insulating film made up of silicon oxide or the like.

Transfer electrodes 5 are formed of W (tungsten) or the like and covered with a light shielding film having an opening above solid-state image sensors 3. On the transfer electrodes 5 covered with a light shielding film, BPSG film 6 deposited by atmospheric pressure CVD and reflowed is formed.

The BPSG film 6 is formed to have portions that take shape of a convex lens one surface of which is convex downwards. In the convex-lens-shaped portions, inner-layer lenses 7 are formed by subjecting SiN, which has a high refractive index and high transparency, to plasma CVD.

Above the inner-layer lenses 7, a planarized layer 10, which is formed of an organic resin flim, BPSG film or silicon oxide-based insulating film, is formed.

On the planarized layer 10, a color filter 8 made up of three primary colors, red (R), green (G) and blue (B), is formed. On the color filter 8, microlenses 9 are formed using a photo resist material.

Solid-state imaging device 1 has such structure. Light having entered microlenses 9 passes through the color filter 8, whereby light of each color is extracted. And light of each color gathered by the inner-layer lenses 7 are converted into electric signals by solid-state image sensors 3.

In the following a color filter manufacturing method of the present invention will be described. FIGS. 2A to 2H are cross-sectional views illustrating the color filter manufacturing method of the present invention.

Figure 2A:
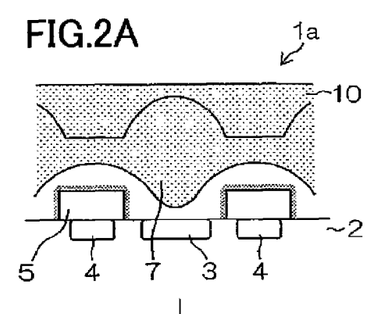
FIGS. 2A to 2H are cross-sectional views illustrating the color filter manufacturing method according to embodiments of the present invention.
Figure 2B:
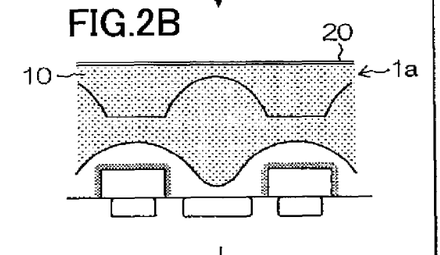

The color filter manufacturing method of the present invention includes a stopper layer forming step. In the stopper layer forming step, a stopper layer 20 is formed on a substrate 1a as a support, which includes the planarized layer 10 as shown in FIG. 2A. In more particular, stopper layer 20 is formed on the planarized layer 10 of the substrate 1a, as shown in FIG. 2B.

The stopper layer 20 is deposited by method such as plasma deposition or wet spin coating and the solvent used etc. is removed by baking.

The material used for the stopper layer 20 contains any one metal selected from the group consisting of Si, Ti, Al, Zr, Ta and Ce and is transparent in the visible light area.

The stopper layer 20 is formed to have a thickness of 5 nm to 200 nm, preferably 20 nm to 150 nm, and more preferably 50 nm to 100 nm.

The etching rate of the stopper layer 20 by the second mixed gas, which is used in the second etching step described later, is low. And the second mixed gas selectivity of the stopper layer 20 to the colored layer described later is 5 or more, preferably 10 or more, and more preferably 20 or more.

The substrate 1a as a support can be any substrate for which a color filter is used. Examples of such substrates include: those used in liquid crystal display devices, such as soda glass, borosilicate glass, quartz glass and these types of glass on which a transparent conductive thin film is deposited; and photoelectric converter substrates, which are used in solid-state image sensors, such as silicon substrate, oxide film and silicon nitride. Between the support and the colored layer, to the extent that the fluorine-based gas does not impair the effect of the present invention other layers such as intermediate layers can be provided.

Figure 2C:
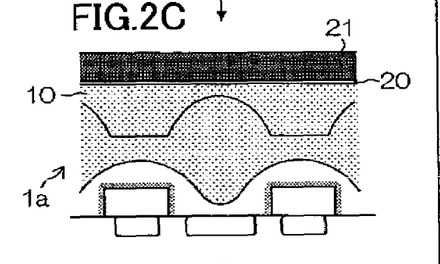

The color filter manufacturing method according to embodiments of the present invention also includes a colored layer forming step in which colored layer 21 is formed on stopper layer 20, as shown in FIG. 2C. Colored layer 21 can constitute at least one kind of color filter pixels. Preferably, colored layer 21 is formed of a curable composition containing a colorant.

Examples of curable compositions include photo-curable colored compositions and non-photosensitive thermosetting colored compositions. It is preferable from the viewpoint of spectral characteristics to form colored layer 21 using a non-photosensitive thermosetting colored composition.

Preferably, the non-photosensitive thermosetting colored composition contains a colorant and a thermosetting compound and the concentration of the colorant in the total solid constituents is 50% by mass or more and less than 100% by mass.

The photo-curable colored composition contains at least a colorant and photo-curable constituent. A photo-curable composition which is commonly used in photolithography process and contains at least a binder resin (alkali-soluble resin etc.), photosensitive polymerizable constituent (photopolymerizable monomer etc.) and photo-polymerization initiator can be used as the "photo-curable constituent".

For the photo-curable colored composition, the particulars described in Japanese Patent Application Laid-Open No. 2005-326453, paragraph numbers 0017 to 0064 can be suitably applied.

The colored layer forming step according to embodiments of the present invention can include: a step of forming a film by applying the photo-curable colored composition onto the stopper layer 20 directly or via other layers and drying the applied composition (film forming step); and a step of applying heat treatment to the formed film (post bake step).

The colorant contained in the photo-curable colored composition and non-photosensitive thermosetting colored composition both of which are used for colored layer 21 is not limited to any specific one. Various types of currently known dyes or pigments can be used independently or two or more of the same in the mixed state.

Examples of such pigments include various types of currently known inorganic or organic pigments. Considering that a pigment having a high transmission is preferable whether it is an inorganic pigment or whether it is an organic pigment, it is preferable to use a pigment whose average particle size is as small as possible. Also considering the handleability, the average particle size of the above pigment is preferably 0.01 μm to 0.1 μm and more preferably 0.01 μm to 0.05 μm.

Examples of pigments preferably used in the present invention include: but not limited to, the following.
C.I. Pigment Yellow 11, 24, 108, 109, 110, 138, 139, 150, 151, 154, 167, 180, 185;
C.I. Pigment Orange 36, 71;
C.I. Pigment Red 122, 150, 171, 175, 177, 209, 224, 242, 254, 255, 264;
C.I. Pigment Violet 19, 23, 32;
C.I. Pigment Blue 15:1, 15:3, 15:6, 16, 22, 60, 66; and
C.I. Pigment Black 1.

In the case that the colorant is a dye, a non-photosensitive thermosetting colored resin composition can be obtained by dissolving the dye uniformly in the composition.

The dye usable as a colorant which constitutes the composition used in the present invention is not limited to any specific one, and any dyes currently known as dyes for use in color filters can be used.

In terms of chemical structure, dyes, such as pyrazole azo, aniline azo, triphenylmethan, anthraquinone, anthrapyridone, benzilidene, oxonol, pyrazolotriazole azo, pyridine azo, cyanine, phenothiazine, pyrrolopyrazole azomethine, xanthene, phthalocyanine, benzopyrane and indigo dyes, can be used.

The content percentage of colorant, in the total solid constituents, of the thermosetting colored composition used in the present invention is preferably, but not limited to, 50% by mass or more and less than 100% by mass and more preferably 55% by mass or more and 90% by mass or less. If the content percentage is 50% by mass or more, chromaticity suitable for color filters can be obtained, whereas if the content percentage is less than 100% by mass, photo curing can be made fill progress, whereby the deterioration of film strength can be retarded.

The thermosetting compound to be contained in the non-photosensitive thermosetting colored composition is not limited to any specific one as long as the compound allows film curing by heating. For example, a compound having a thermosetting functional group can be used. Preferably, such thermosetting compounds are compounds having at least one group selected from the group consisting of epoxy, methylol, alkoxymethyl and acyloxymethyl groups.

More preferable thermosetting compounds include: for example, (a) epoxy compounds; (b) melamine, guanamine, glycoluril or urea compounds which are substituted with at least one substituent selected from the group consisting of methylol, alkoxymethyl and acyloxymethyl groups; (c) phenol, naphthol or hydroxyanthracene compounds which are substituted with at least one substituent selected from the group consisting of methylol, alkoxymethyl and acyloxymethyl groups. Of these thermosetting compounds, multifunctional epoxy compounds are particularly preferable as the thermosetting compounds.

The total content percentage of the foregoing thermosetting compounds in the thermosetting colored composition is preferably 0.1 to 50% by mass, more preferably 0.2 to 40% by mass and particularly preferably 1 to 35% by mass to the total solid constituents (by mass) of the thermosetting compounds.

To the thermosetting colored composition used in colored layer 21 of the present invention, various kinds of additives, such as binders, curing agents, curing catalysts, solvents, fillers, polymer compounds other than the above additives, surfactants, adhesion promoters, antioxidants, ultraviolet absorbers, cohesion inhibitor or dispersants, can be added, if necessary, to the extent that their addition does not impair the effect of the present invention.

A binder is, in many cases, added when preparing a pigment dispersion liquid, and it need not be alkali-soluble, but should be soluble in an organic solvent. A binder is preferable which is a linear organic high molecular weight polymer and soluble in an organic solvent. Examples of linear organic high molecular weight polymers include polymers having a carboxylic acid on their side chains, such as methacrylic acid copolymers, acrylic acid copolymers, itaconic acid copolymers, crotonic acid copolymers, maleic acid copolymers or partially esterified maleic acid copolymers described in Japanese Patent Application Laid-Open No. 59-44615, Japanese Examined Application Publication Nos. 54-34327, 58-12577 and 54-25957, Japanese Patent Application Laid-Open Nos. 59-53836 and 59-71048. Acidic cellulose derivatives having a carboxylic acid on their side chains are also useful.

Of these various types of binders, from the viewpoint of heat resistance, preferable are polyhydroxystyrene resins, polysiloxane resins, acrylic resins, acrylamide resins, and acryl/acrylamide copolymer resins. And from the viewpoint of controlling developability, preferable are acrylic resins, acrylamide resins and acryl/acrylamide copolymer resins.

Particularly in acrylic resins, preferable are copolymers composed of monomers selected from benzyl(meth)acrylate, (meth)acrylic acid, hydroxyethyl(meth)acrylate and (meth)acrylamide. For example, copolymers such as benzylmethacrylate/methacrylic acid and benzylmethacrylate/benzylmethacrylamide, KS resist-106 (manufactured by OSAKA ORGANIC CHEMICAL INDUSTRY, LTD.), and Cychroma-P series (manufactured by DAICEL CHEMICAL INDUSTRIES, LTD.) are preferable.

Dispersing any one of the above colorant in one of these binders at high concentrations provides adhesion to the lower layer. These binders also contribute to the coating conditions of the coating surface at the time of spin coating or slit coating.

When using an epoxy resin as a thermosetting compound in the present invention, it is preferable to add a curing agent. There are so many kinds of curing agents for epoxy resins, and the properties, usable time of the mixture of an epoxy resin and a curable agent, viscosity, curing temperature, curing time, heat release, etc. greatly differ depending on the kind of the curing agent used; therefore, an appropriate curing agent should be selected depending on the purpose and conditions of curing agent use, operating conditions, etc. The details of the above curing agents are described in Hiroshi Kakiuchi (ed.): *Epoxy Resins*, (Syokodo) Chapter 5. Examples of the curing agents are as follows.

Curing agents having catalytic action include: for example, tertiary amines and boron trifluoride-amine complex. Curing agents stoichiometrically reacting with a functional group of an epoxy resin include: for example, polyamines and acid anhydrides. Curing agents curing at ordinary temperature include: for example, diethylenetriamine and polyamide resins. Curing agents curing at moderate temperature include: for example, diethylaminopropylamine and tris(dimethylaminomethyl)phenol. Curing agents curing at high temperature include: for example, phthalic anhydride and metaphenylenediamine. In terms of chemical structure, curing agents include: those of amines such as diethylenetriamine as an aliphatic polyamine, metaphenylenediamine as an aromatic polyamine and tris(dimethylaminomethyl)phenol as a tertiary amine; those of acid anhydrides such as phthalic anhydride; polyamide resin; polysulfide resin; boron trifluoride-amine complex; those of synthetic resin primary condensation product such as phenol resin; and dicyandiamide.

These curing agents react with an epoxy group when heated and are polymerized, whereby the epoxy resin is allowed to have an increased crosslinking density and cured. To form a thinner film, it is preferable to use the smallest possible amount of binder and curing agent. For the curing agent, preferably its amount is 35% by mass or less, preferably 30% by mass or less and more preferably 25% by mass or less of the thermosetting compound to which it is added.

To realize a high colorant concentration in the present invention, not only curing attributed to the reaction with any one of the foregoing curing agents, but also curing attributed to the reaction among the epoxy groups is available. Thus, it is possible not to use a curing agent, but to use a curing catalyst. An epoxy resin with an epoxy equivalent of about 150 to 200 can be cured using such a curing catalyst in an amount, relative to the amount of the epoxy resin on the mass basis, as small as about 1/10 to 1/1000, preferably about 1/20 to 1/500, and more preferably 1/30 to 1/250.

The thermosetting colored composition used in the present invention can be used in the form of a solution in one of various types of solvents. Basically, any solvent can be used for the thermosetting colored composition of the present invention as long as it satisfies the solubility of each component and the coating properties of the thermosetting colored composition.

The dispersant described above can be added to improve the dispersibility of the pigment. Any one appropriately selected from known dispersants can be used as the dispersant. Examples of such dispersants include: cationic surfactants, fluorinated surfactants, and polymer dispersants.

Many kinds of compounds are used as the dispersant. Examples of such compounds include: phthalocyanine derivatives (commercially available ones, EFKA-745 (manufactured by EFKA ADDITIVES) ) and Sorsperse 5000 (manufactured by The Lubrizol Corporation); cationic surfactants such as orgnosiloxane polymer KP341 (manufactured by Shin-Etsu Chemical Co., Ltd.), (meth)acrylic (co) polymer Polyflow No. 75, No. 90 and No. 95 (manufactured by KYOEISHA CHEMICAL Co., Ltd., and W001 (manufactured by Yusho Co., Ltd.); nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester; anionic surfactants such as W004, W005 and W017 (manufactured by Yusho Co., Ltd.); polymer dispersants such as EFKA-46, EFKA-47, EFKA-47EA, EFKA polymer 100, EFKA polymer 400, EFKA polymer 401, EFKA polymer 450 (so far manufactured by Morishita & Co., Ltd.), Disperse Aid 6, Disperse Aid 8, Disperse Aid 15 and Disperse Aid 9100 (manufactured by Sannopeo); various kinds of Sorsperse dispersants such as Sorsperse 3000, 5000, 9000, 12000, 13240, 13940, 17000, 24000, 26000, 28000 (manufactured by The Lubrizol Corporation); Adeka pulronic L31, F38, L42, L44, L61, L64, F68, L72, P95, F77, P84, F87, P94, L101, P103, F108, L121, P-123 (manufactured by Asahi Denka); and ISONET S-20 (manufactured by Sanyo Chemical Industries).

The above dispersants can be used independently or in combination of two or more. The amount of the dispersant(s) added to the thermosetting colored composition used in the present invention is usually preferably about 0.1 to 50 parts by mass per 100 parts of pigment.

To the non-photosensitive thermosetting colored composition of the present invention, various kinds of additives can also be added. Concrete examples of various kinds of additives include those described in Japanese Patent Application Laid-Open No. 2005-326453, which has been described above.

Colored layer 21 of the present invention can be formed by, for example, applying the thermosetting colored composition described above onto stopper layer 20 and drying the same. Specifically, Colored layer 21 can be formed by applying the thermosetting colored composition of the present invention, including a solvent, onto a support by spin coating, slit coating, cast coating or roll coating.

The specific thickness of the colored layer is preferably 0.005 μm to 0.9 μm, more preferably 0.05 μm to 0.8 μm, and much more preferably 0.1 μm to 0.7 μm.

Preferably the colored layer forming step of the present invention further includes a heating step (this can be a post bake step). Specifically, the foregoing colored layer can be formed by applying the thermosetting colored composition of the present invention onto a support to form a film on the same and thermo-setting the formed film through the heating step. The heating step may be carried out at the same time that drying after application of the thermo-setting colored composition is carried out, or a thermo-setting step may be separately provided after applying and drying of the thermosetting colored composition. The heating step can be carried out using a known heating device such as an oven or hot plate preferably at 130° C. to 300° C., more preferably at 150° C. to 280° C. and particularly preferably 170° C. to 260° C., preferably for 10 seconds to 3 hours, more preferably for 30 seconds to 2 hours and particularly preferably for 60 seconds to 60 minutes. Considering the manufacturing, the shorter the time required for curing, the more preferable.

Figure 2D:
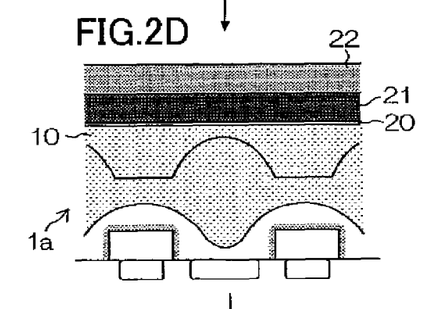

Subsequently, a photo resist layer forming step in which a photo resist layer is formed on colored layer 21 is carried out.

In the photo resist layer forming step, photo resist layer 22 (photosensitive resin layer) is formed on colored layer 21, the colored layer 21 has been formed on stopper layer 20 in the colored layer forming step, as shown in FIG. 2D.

Specifically, photo resist layer 22 is formed by applying a positive-type or negative-type of photosensitive resin composition onto colored layer 21 and drying the same. In the formation of photo resist layer 22 of the present invention, it is preferable to perform pre-bake treatment.

For the positive-type or negative-type of photosensitive resin composition, for example, the particulars described in Japanese Patent Application Laid-Open No. 2007-11324, paragraph numbers 0112 to 0117 can be suitably applied in the present invention.

The foregoing coating methods can be suitably used for coating of the photosensitive resin composition. The specific thickness of the photosensitive resin composition layer formed is preferably 0.01 μm to 3 μm, more preferably 0.1 μm to 2.5 μm, and much more preferably 0.15 μm to 2 μm.

A positive-type of resist composition suitable for a positive-type of photo resist which is responsive to ionizing radiation, such as ultraviolet rays (g-ray, i-ray), far ultraviolet rays including excimer laser, electron radiation, ion beams and X-rays, can be used as a positive-type of photosensitive resin composition. Of ionizing radiation, g-ray and i-ray are preferable, in light of the object of the present invention, as ionizing radiation to which the photosensitive resin layer is exposed. And i-ray exposure is particularly preferable.

In the color filter manufacturing method of the present invention, colored layer 21 can be formed into a desired shape (e.g. rectangle) by applying etching treatment, using photo resist layer 22 as a mask, in the etching step described later.

Figure 2E:
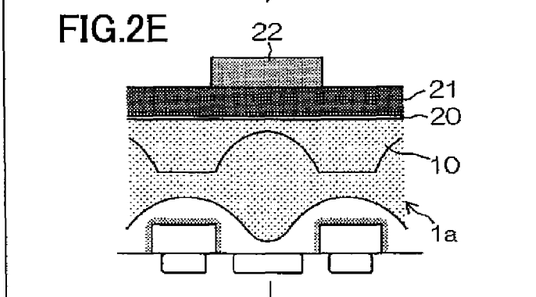

Subsequently, the image forming step is carried out in which an image is formed on colored layer 21 by removing formed photo resist layer 22 to a pattern.

In the image forming step, photo resist layer 22 is exposed to a desired pattern, for example, a pattern corresponding to the area of stopper layer 20 on which a second colored layer colored differently from colored layer 21 is formed, and the exposed portion is developed with a developer to form an etching mask (pattern image), as shown in FIG. 2E.

The surface (the surface opposite to the surface side in which the stopper layer 20 and the colored layer 21 are facing) of colored layer 21, which is to be a first colored layer, is exposed to a pattern in the image forming step. The area of colored layer 21 other than the area where a second colored layer is formed on stopper layer 20 is covered with photo resist layer 22.

After the image forming step, each step such as etching step is carried out to form colored layer 21 to a pattern and again each step is carried out to form a second colored layer on stopper layer 20, whereby, in addition to the pixels made up of colored layer 21 having been formed to a pattern, another type of pixels is formed.

Photo resist layer 22, which is to be a mask material, can undergo fine size-reduction and has rectangularity, whereby the pixels of the color filter can be made fine and rectangular.

Exposure of photo resist layer 22 is carried out in such a manner as to expose a positive-type or negative-type of photosensitive resin composition to g-ray, h-ray or i-ray, preferably to i-ray.

The developer used can be any developer as long as it does not affect colored layer 21, which contains a colorant, and it dissolves the exposed portion of the posi resist and the non-cured portion of the nega resist. Specifically, a combination of various kinds of organic solvents or an alkaline aqueous solution can be used.

Figure 2F:
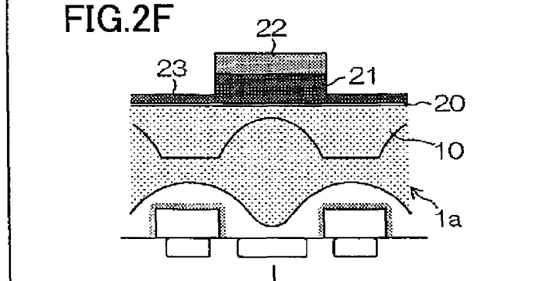

Subsequently, a first etching step is carried out using a first mixed gas. In the first etching step, anisotropic etching is carried out by dry etching process (e.g. plasma etching treatment. There are known, as representative examples, dry etching processes described in Japanese Patent Application Laid-Open Nos. 59-126506, 59-46628, 58-9108, 58-2809, 57-148706, 61-41102) using the first mixed gas, which contains fluorine-based gas and oxygen gas, to remove part of colored layer 21 to the extent that stopper layer 20 is not exposed, thereby forming colored-layer removed portion 23 to the pattern having been formed in the image forming step, as shown in FIG. 2F.

As described above, in the first etching step, when forming colored-layer removed portion 23 to the pattern having been formed in the image forming step, etching treatment is terminated before stopper layer 20 is exposed, whereby occurrence of damage to substrate 1a as a support can be avoided.

The first mixed gas used in the first etching step should contain at least one kind of fluorine-based gas and oxygen gas, from the viewpoint of being able to process the colored layer portion to be removed by dry etching process (portion to be etched) into a rectangular shape.

The fluorine-based gas used can be any known fluorine-based gas, but preferably the fluorine-based gas is a gas of fluorine-based compound expressed by the following formula (I).

$$C_nH_mF_l \qquad \text{Formula (I)}$$

wherein n represents 1 to 6, m 0 to 13 and l 1 to 14.

Examples of fluorine-based gases expressed by formula (I) include: at least one selected from the group consisting of $CF_4$, $C_2F_6$, $C_3F_8$, $C_2F_4$, $C_4F_8$, $C_4F_6$, $C_5F_8$ and $CHF_3$. The fluorine-based gas used in the present invention can be one selected from the above group or the combination of two or more gases selected from the same.

From the viewpoint of maintaining the rectangularity of the etched portion, the fluorine-based gas used in the present invention is preferably one selected from the group consisting of $CF_4$, $C_2F_6$, $C_4F_8$ and $CHF_3$, more preferably $CF_4$ and/or $C_2F_6$, and particularly preferably $CF_4$.

The content ratio of fluorine-based gas to oxygen gas (fluorine-based gas/oxygen gas) in the first mixed gas is preferably 2/1 to 8/1, in terms of flow rate ratio. If the content ratio is within this range, the deposition of the etching product on the side wall of photo resist layer 22 during etching treatment can be prevented and the stripping of photo resist layer 22 in the photo resist layer 22 removing step, which is described later, is made easy. Particularly in terms of preventing the re-deposition of the etching product on the side wall of the photo resist while maintaining the rectangularity of the etched portion, the content ratio of fluorine-based gas to oxygen gas is preferably 2/1 to 6/1 and particularly preferably 3/1 to 5/1.

Further, from the viewpoint of maintaining the partial pressure control stability of etching plasma and the perpendicularity of etched shape, it is preferable for the first mixed gas to contain not only fluorine-based gas and oxygen gas, but at least one kind of gas selected from the group consisting of: rare gases, such as helium (He), neon (Ne), argon (Ar), krypton (Kr) and xenon (Xe); halogen-based gases containing halogen atoms such as chlorine, fluorine or bromine atoms (e.g. $CCl_4$, $CClF_3$, $AlF_3$, $AlCl_3$); $N_2$; CO and $CO_2$, more preferable to contain at least one kind of gas selected from the group consisting of Ar, He, Kr, $N_2$ and Xe, and much more preferable to contain at least one kind of gas selected from the group consisting of He, Ar, and Xe.

However, in the case that it is possible to maintain the partial pressure control stability of etching plasma and the perpendicularity of etched shape, the first mixed gas may be composed of fluorine-based gas and oxygen gas.

In the first mixed gas, the content of the gases which the first mixed gas can contain besides fluorine-based gas and oxygen gas is preferably 25 or less, more preferably 10 or more and 20 or less, and particularly preferably 14 or more and 18 or less in terms of flow rate ratio when it is assumed that the flow rate of oxygen gas is 1.

Colored-layer removed portion 23 is formed by removing, by dry etching process, part of colored layer 21 having been formed on stopper layer 20. In other words, colored-layer removed portion 23 where a part of the colored layer 21 has been removed is formed by terminating, when carrying out a dry etching of the colored layer 21 having been exposed to a pattern using the first mixed gas, the dry etching treatment before the stopper layer 20 under the colored layer 21 is exposed.

The film thickness of the colored-layer removed portion 23 is preferably 50% or less of the film thickness of the colored layer 21, which has been formed on the stopper layer 20, and more preferably 10 to 20%, from the viewpoint of maintaining the pattern rectangularity.

To terminate dry etching treatment, while ensuring the above film thickness, before the stopper layer 20 is exposed, it is preferable to terminate the dry etching treatment after a specified time has elapsed since the start of the dry etching treatment.

The time of dry etching treatment is calculated by: first calculating the etching rate (nm/min.) in the first etching step; and then calculating, from the calculated etching rate, the time required for dry etching the colored layer to a desired thickness in the first etching step.

The etching rate can be calculated by, for example, obtaining the relationship between the etching time and the residual film.

The time of the etching treatment carried out in the present invention is preferably 10 minutes or less and more preferably 7 minutes or less.

The internal pressure of the chamber in the first etching step is preferably 2.0 to 6.0 Pa and more preferably 4.0 to 5.0 Pa. Keeping the internal pressure of the chamber in the above range makes the rectangularity of the pattern good and retards the deposition, on the photo resist, of the side wall protecting film produced by etching treatment.

The internal pressure of the chamber can be controlled by, for example, appropriately controlling the flow rate of the etching gas and the pressure reduction of the chamber.

In the first etching step, the temperature of substrate 1a is preferably 30° C. or higher and 100° C. or lower. Keeping the temperature of substrate 1a in the above range makes it possible to retard the deposition of the etching product on the side wall of photo resist layer 22, thereby making easier the stripping of photo resist layer 22 in the photo resist layer removing step described later. Particularly from the viewpoint of maintaining the rectangularity of the etched portion and retarding the re-deposition of the etching product on the side wall of the photo resist layer, the temperature of the substrate is preferably 30° C. to 80° C. and particularly preferably 40° C. to 60° C.

In the first etching step, the temperature of substrate 1a can be kept at 30° C. or higher and 100° C. or lower by, for example, controlling the temperature of the wafer stage to be at 30° C. or higher and 100° C. or lower.

The dry etching conditions in the first etching step differ depending on the material used for colored layer 21 or the thickness of the same. In the following, preferred dry etching conditions other than those described above will be described.

The flow rate of the first mixed gas is preferably 1500 mL/min or less (0° C., 1013 hPa) and more preferably 500 to 1000 mL/min (0° C., 1013 hPa).

Radio frequency can be selected from 400 kHz, 60 MHz, 13.56 MHz and 2.45 GHz and the treatment can be carried out at RF power of 50 to 2000 W and preferably 100 to 1000 W.

For the relationship between source power (RF) and bias, preferably RF power/antenna bias/substrate bias (wafer bias) is 600 to 1000 W/300 to 500 W/150 to 250 W and more preferably 700 to 900 W/350 to 450 W/200 W.

Figure 2G:
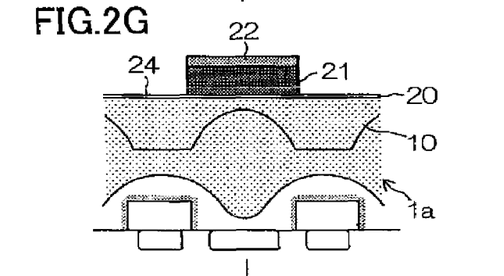

Subsequently, a second etching step is carried out using a second mixed gas. In the second etching step, anisotropic etching is carried out by dry etching process (e.g. plasma etching treatment) using the second mixed gas, which contains nitrogen gas and oxygen gas, to remove the colored layer removed portion 23, thereby forming the stopper-layer exposed portion 24 into a pattern, as shown in FIG. 2G.

Previously, when doing etching treatment using the first mixed gas alone until the substrate 1a, as a support which was located under the stopper layer 20 and made up of planarized layer 10 etc., was exposed, damage to the support tended to occur. And the occurrence of the damage was noticeable particularly when carrying out over-etching treatment. In the present invention, however, the second etching step is carried out using the second mixed gas, which contains nitrogen gas and oxygen gas and is different from the first mixed gas, thereby enabling etching in which the occurrence of the damage to the support is retarded.

Carrying out the second etching step using the second mixed gas, which contains nitrogen gas and oxygen gas, makes it possible to remove the damage layer having been caused by plasma and formed on the surface layer of the photo resist layer 22 in the first etching step. This makes it easier to strip the photo resist layer 22 with a stripper or solvent in the photo resist layer removing step described later.

Furthermore, the stopper layer 20 having been formed on the plamarized layer 10 of substrate 1a is only slightly etched by the second mixed gas, because its etching rate by the second mixed gas is low, whereby no damage occurs in the support located under stopper layer 20.

Although the second mixed gas used in the second etching step contains nitrogen gas and oxygen gas, it can also contain a fluorine-based gas to the extent that the fluorine-based gas does not impair the effect of the present invention. Preferably the content ratio of the fluorine-based gas (fluorine-based gas/oxygen gas) is 5% or less, in terms of flow rate ratio, and particularly preferably the second mixed gas contains no fluorine-based gas. Keeping the content of the fluorine-based gas in the above range enables more effective retardation on the substrate damage.

The content ratio of nitrogen gas to oxygen gas (nitrogen gas/oxygen gas) in the second mixed gas is preferably 10/1 to 3/1 in terms of flow rate ratio. Keeping the content ratio in the above range makes it possible to more effectively retard the deposition of the etching product on the side wall of the photo resist layer 22 during etching treatment and makes easier the stripping of the photo resist layer 22 in the photo resist layer 22 removing step described later. In terms of maintaining the rectangularity of the etched portion and preventing the re-deposition of the etching product on the side wall of photo resist layer 22, the content ratio is preferably 20/1 to 3/1, more preferably 15/1 to 4/1, and particularly preferably 10/1 to 5/1.

From the viewpoint of maintaining the partial pressure control stability of etching plasma and the perpendicularity of etched shape, it is preferable for the second mixed gas to contain not only nitrogen gas and oxygen gas, but at least one kind of gas selected from the group consisting of: helium (He), neon (Ne), argon (Ar), krypton (Kr) and xenon (Xe) and more preferable to contain at least one kind of gas selected from the group consisting of He, Ar, and Xe.

However, in the case that it is possible to maintain the partial pressure control stability of etching plasma and the perpendicularity of etched shape, the second mixed gas may be composed of nitrogen gas and oxygen gas.

In the second mixed gas, the content of the gases which the second mixed gas can contain besides nitrogen gas and oxygen gas is preferably 25 or less, more preferably 5 or more and 20 or less, and particularly preferably 8 or more and 12 or less in terms of flow rate ratio when it is assumed that the flow rate of oxygen gas is 1.

In the second etching step of the present invention, dry etching treatment can be terminated after the treatment time calculated in the same manner as in the first etching step has elapsed since, for example, the start of the dry etching treatment for removing colored layer removed portion 23. The dry etching treatment time for removing the colored layer removed portion 23 can be managed by detecting the end point of etching. In the second etching step of the present invention, preferably the dry etching treatment time for removing the colored layer removed portion 23 is managed by detecting the end point of etching.

The time of the etching treatment carried out in the present invention is preferably 10 minutes or less and more preferably 7 minutes or less.

Preferably the second etching step further includes an over-etching treatment step. If over-etching treatment using the second mixed gas is carried out after the colored layer removed portion 23 is removed by dry etching using the second mixed gas and the stopper layer exposed portion 24 is formed, the etching residues can be efficiently removed while maintaining the rectangularity of the pattern, and besides, the occurrence of the damage to the support can be effectively retarded.

Preferably the over-etching treatment is carried out fixing the over-etching time. Although the over-etching time can be arbitrary fixed, in terms of maintaining the etching resistance of the photo resist layer 22 and the rectangularity of the etched pattern, preferably it is 30% or less of the total treatment time (t1+t2) which is the sum of the etching treatment time in the first etching step (t1) and the etching treatment time for removing the colored layer removed portion in the second etching step (t2), more preferably 5 to 25% of the same, and particularly preferably 15 to 20% of the same.

In the present invention, the internal pressure of the chamber in the second etching step is preferably 1.0 to 5.0 Pa and more preferably 2.0 to 4.0 Pa.

Under the conditions that satisfy the foregoing mixing ratio of the mixed gases and internal pressure of the chamber, a pattern can be more efficiently formed while avoiding impairment of the pattern rectangularity and retarding the occurrence of the damage to the support.

For the relationship between source power (RF) and bias in the second etching step, preferably RF power/antenna bias/substrate bias is 400 to 800 W/50 to 200 W/100 to 300 W and more preferably 500 to 700 W/100 to 150 W/200 to 300 W.

The particulars described in the first etching treatment step can be suitably applied to the conditions, including the support temperature at the time of etching treatment, in the second etching treatment step.

Figure 2H:
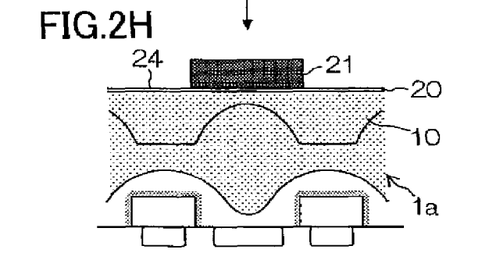

Subsequently, a photo resist layer removing step is carried out in which the photo resist layer 22 remaining after the second etching step is removed. In the photo resist layer removing step, the photo resist layer 22 as a mask is brought to the removable state with a special stripper or solvent and then removed with washing water, as shown in FIG. 2H.

In the present invention, the second etching step is carried out in which the second mixed gas, which contains nitrogen gas and oxygen gas, is used, whereby stripping of the photo resist layer 22 using a stripper or solvent can be made more easily.

To bring photo resist layer 22 to the removable state by providing the same with a stripper or solvent, a puddle phenomenon step can be carried out in which a stripper or solvent is provided at least on the surface of photo resist layer 22 and allowed to accumulate on the same for a specified time. The time for accumulating a stripper or solvent is preferably, but not limited to, several ten seconds to several minutes.

To remove the photo resist layer using washing water, washing water is sprayed on the photo resist layer 22 through a spray-type or shower-type of nozzle. Pure water can be preferably used as washing water.

Examples of nozzles include: a nozzle whose spraying range covers the entire support; and a movable nozzle whose movable range covers the entire support. In the case that the nozzle is a movable nozzle, if the nozzle is allowed to spray washing water, while moving from the center of the substrate 1a to the end of the same twice or more, during the photo resist layer 22 removing step, the photo resist layer 22 can be removed more effectively.

Generally strippers contain an organic solvent, but they may contain an inorganic solvent. Examples of the organic solvents contained in strippers include: hydrocarbon compounds, halogenated hydrocarbon compounds, alcohol compounds, ether or acetal compounds, ketone or aldehyde compounds, ester compounds, polyhydric alcohol compounds, carboxylic acid compounds or compounds of acid anhydrides of carboxylic acids, phenol compounds, nitrogen-containing compounds, sulfur-containing compounds, and fluorine-containing compounds.

The stripper used in the present invention preferably contains a nitrogen-containing compound and more preferably a non-cyclic nitrogen-containing compound and a cyclic nitrogen-containing compound.

Preferably the non-cyclic nitrogen-containing compound has a hydroxyl group. Concrete examples of non-cyclic nitrogen-containing compounds having a hydroxyl group include: monoisopropanolamine, diisopropanolamine, triisopropanolamine, N-ethylethanolamine, N,N-dibutylethanolamine, N-butylethanolamine, monoethanolamine, diethanolamine, and triethanolamine. Of these compounds, monoethanolamine, diethanolamine, and triethanolamine are preferable and monoethanolamine ($H_2NCH_2CH_2OH$) is more preferable.

Examples of cyclic nitrogen-containing compounds include: isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine, N-methyl-2-pyrrolidone, N-phenylmorpholine, 2,4-lutidine, and 2,6-lutidine. Of these compounds, N-methyl-2-pyrrolidone and N-ethylmorpholine are preferable and N-methyl-2-pyrrolidone (NMP) is more preferable.

Preferably the stripper used in the present invention contains a non-cyclic nitrogen-containing compound and a cyclic nitrogen-containing compound, as described above. More preferably the stripper contains at least one selected from the group consisting of monoethanolamine, diethanolamine and triethanolamine, as a non-cyclic nitrogen-containing compound, and at least one selected from the group consisting of N-methyl-2-pyrrolidone and N-ethylmorpholine, as a cyclic nitrogen-containing compound. And much more preferably the stripper contains monoethanolamine and N-methyl-2-pyrrolidone.

Desirably, the content of the non-cyclic nitrogen-containing compound is 9 parts by mass or more and 11 parts by mass or less per 100 parts by mass of the stripper, while that of the cyclic nitrogen-containing compound is 65 parts by mass or more and 70 parts by mass or less.

The stripper used in the present invention is preferably a dilution of the mixture of a non-cyclic nitrogen-containing compound and a cyclic nitrogen-containing compound prepared using pure water.

A two-color color filter is fabricated by forming, after stripping the photo resist layer 22, a colored layer different from the colored layer having been formed on the stopper layer exposed portion 24. And a multi-color color filter is fabricated by again forming a photo resist layer on a two-color color filter and repeating the image forming step, first etching step, second etching step and photo resist layer removing step.

EXAMPLES

In the following the present invention will be described in detail by examples; however, it is to be understood that the invention is not limited to these examples.

When using a commercial treatment solution to carry out treatment in each of the steps described below, unless otherwise specified, each treatment was carried out in accordance with the method designated by the manufacturer In the support forming step in examples, the plarnarized layer 10, as shown in FIGS. 2A to 2H, was formed on a silicon wafer. First a silicon wafer was coated with a negative-type plarnarized layer, CT-4000L, manufactured by FUJIFILM Electronic Materials Co., Ltd., using a spin coater (Mark 8, manufactured by Tokyo Electron Ltd.), then subjected to flood exposure at an exposure dose of 200 mJ/cm$^2$ using an i-ray stepper (FPA3000i5+, manufactured by Canon Inc.), followed by 5-minute heating at 220° C. using a hot plate to form a planarized layer having a thickness of 0.1 μm.

In the stopper layer forming step, first ACCUGLASS, manufactured by RASA Industries, LTD., was applied onto the plarnarized layer, CT-4000L, using a spin coater (Mark 8, manufactured by Tokyo Electron Ltd.) and then subjected to 5-minute heating at 220° C. using a hot plate to form a stopper layer 20 having a thickness of 0.1 μm.

In the colored layer forming step, first SG-5000L, manufactured by FUJIFILM Electronic Materials Co., Ltd., was applied onto the stopper layer 20 using a spin coater (Mark 8, manufactured by Tokyo Electron Ltd.) to form a film having a thickness of 0.8 μm. Then the formed film was heated at 220° C. for 5 minutes using a hot plate to cause curing to form colored layer 21. The film thickness of the colored layer 21 having been formed using the pigment-containing thermosetting composition (thermosetting colored composition) was 0.6 μm.

In the photo resist layer forming step, a positive-type of photo resist, "FHi622BC" (manufactured by FUJIFILM Electronic Materials Co., Ltd.), was applied onto SG-5000L described above using a spin coater (Mark 8, manufactured by Tokyo Electron Ltd.) and subjected to 2-minute heat treatment at 100° C. to form a photo resist layer 22 having a film thickness of 0.8 μm.

In the image forming step, a 1.5 μm×1.5 μm island pattern was formed by subjecting the area corresponding to RED filter arrays to: pattern exposure at an exposure dose of 350 mJ/cm$^2$ using an i-ray stepper (FPA3000i5+, manufactured by Canon Inc.); 1-minute heat treatment at 110° C.; 1-minute development using a developer, "FHD-5" (manufactured by FUJIFILM Electronic Materials Co., Ltd.), followed by 2-minute post baking at 120° C. to remove the photo resist in the area where RED filter arrays were to be formed.

In the first etching step, 90-second etching treatment was carried out on dry etching apparatus (U-621, manufactured by Hitachi High-Technologies Corporation) under the following etching conditions: RF power of 800 W, antenna bias of 400 W, wafer bias of 200 W, chamber internal pressure of 4.0 Pa, substrate temperature of 50° C., kind and flow rate of mixed gas —$CF_4$ at 200 mL/min., $O_2$ 50 at mL/min. and Ar at 800 mL/min.

The etching rate of SG-5000L under the above etching conditions was 326 nm/min and the amount of colored layer 21 shaved was 489 nm. Accordingly, 81.5% of the film thickness of the colored layer having been formed of SG-5000L was removed in the first etching step, while a SG-5000L residual film (the colored layer removed portion 23) with 111 nm thick was formed on the support.

In the second etching step, etching treatment was carried out on dry etching apparatus (U-621, manufactured by Hitachi High-Technologies Corporation) under the following etching conditions: RF power of 600 W, antenna bias of 100 W, wafer bias of 250 W, chamber internal pressure of 2 Pa, substrate temperature of 50° C., kind and flow rate of mixed gas —$N_2$ at 500 mL/min., $O_2$ at 50 mL/min. and Ar at 500 mL/min. ($N_2/O_2/Ar$=10/1/10), and percentage of over-etching to total etching of 20%.

The etching rate under the second etching conditions was 700 nm/min, and it took about 9.5 seconds to etch the SG-5000L residual film. The total treatment time (total etching time) was calculated by adding 90 seconds, the first etching time, and 9.5 seconds, the second etching time. The results were such that the total etching time: 90+9.5=99.5 seconds and the over-etching time: 99.5×0.2=19.9 seconds. Etching treatment was carried out fixing the overall etching time at 99.5+19.9=119.4 seconds.

In the photo resist layer removing step, 120-second stripping was carried out using a photo resist stripper, "MS-230C" (manufactured by FUJIFILM Electronic Materials Co., Ltd.), to remove the photo resist.

A color filter pattern was formed as described so far, and a single-color color filter was fabricated.

For comparison, in Comparative Example 1, a color filter was fabricated by the currently used method below. In Comparative Example, the stopper layer forming step was eliminated. And the other steps, such as support forming step, colored layer forming step, photo resist layer forming step and image forming step, were carried out in the same manner as in Example to form a silicon wafer having a colored layer with an image of a photo resist layer formed thereon. Then, an etching step, instead of the first etching step and the second etching step, was carried out for the silicon wafer under the following etching conditions to remove the photo resist layer in the same manner as in Example, thereby forming a single-color color filter.

The etching was carried out on dry etching apparatus (U-621, manufactured by Hitachi High-Technologies Corporation) under the following etching conditions: RF power of 800 W, antenna bias of 400 W, wafer bias of 200 W, chamber internal pressure of 4.0 Pa, substrate temperature of 50° C., kind and flow rate of mixed gas —$CF_4$ at 80 mL/min., $O_2$ at 40 mL/min. and Ar at 800 mL/min. The percentage of over-etching was 20%.

It took about 110 seconds to expose the support to a pattern by etching (removing) the colored layer formed of SG-5000L under the above etching conditions. The etching time was thus 110 seconds, and the over-etching time was: 110×0.2=22 seconds, since the percentage of over-etching was 20%. Thus, etching treatment was carried out on the premise that the overall etching time was 110+22=132 seconds.

Further, in Comparative Example 2, a single-color color filter was fabricated by the same method as in Example 1 except that the stopper layer forming step was eliminated.

The color filters fabricated in Example, Comparative Example 1 and Comparative Example 2 in such a manner as described above were evaluated for their strippability by observing the surface of the colored layer with a microscope (×50000 magnification) and observing the surface and side wall of the colored layer with a scanning electron microscope (SEM)(×30000 magnification). The evaluation was carried out based on the following criteria. For the color filter in which photo resist remaining unstripped is not observed on the surface of the colored layer, its strippability is judged to be good. For the color filter in which photo resist remaining unstripped is observed a little on the surface of the colored layer, but within practically permitted limit, its strippability is judged to be fair. For the color filter in which photo resist remaining unstripped is observed on the whole surface of the colored layer, its strippability is judged to be poor. The evaluations are shown in Table 1.

For the rectangularity, evaluation was carried out by the observation with a scanning electron microscope (SEM)(×100000 magnification) and based on the following criteria.

For the color filter in which the cross section of the colored layer is rectangular and no deposit is observed on the entire surface of the resist side wall, its rectangularity is judged to be good. For the color filter in which the rectangularity of the cross section is a little impaired and no deposit is observed on the entire surface of the resist side wall, but within practically permitted limit, its rectangularity is judged to be fair. For the color filter in which the rectangularity of the cross section is markedly impaired, such as in a tapered shape and deposits exist on the whole surface of the resist side wall and beyond practically permitted limit, its rectangularity is judged to be poor. The evaluations are shown in Table 1.

For the damage to the support, evaluation was carried out by the observation with a scanning electron microscope (SEM)(×100000 magnification) and based on the following criteria.

For the color filter in which the damage to the support is not observed, its support damage is judged to be good. For the color filter in which the damage to the support is at tolerable level (unevenness exists, but support shaving is 50 nm or less), its damage to the support is judged to be fair. For the color filter in which support shaving 50 nm or more occurs, its damage to the support is judged to be poor. The evaluations are shown in Table 1.

For the residues, etching misses, evaluation was carried out by the observation with an optical microscope and a surface SEM and based on the following criteria.

For the color filter in which none of residues and etching misses is observed, its residues, etching misses are judged to be good. For the color filter in which etching misses are at tolerable level (residues occur partly in the wafer plane), its residues, etching misses are judged to be fair. For the color filter in which etching misses are beyond practically permitted limit, its residues, etching misses are judged to be poor. The evaluations are shown in Table 1.

TABLE 1

|  | Strippability | Rectangularity | Support damage | Residues, etching misses |
| --- | --- | --- | --- | --- |
| Example 1 | good | fair | good | good |
| Comparative Example 1 | fair | good | poor | good |

TABLE 1-continued

|  | Strippability | Rectangularity | Support damage | Residues, etching misses |
| --- | --- | --- | --- | --- |
| Comparative Example 2 | fair | poor | fair | poor |

As apparent from the results shown in Table 1, in the color filter of Example which was fabricated by the color filter manufacturing method of the present invention, the support damage (the damage to the support) was not observed. The strippability of the photo resist layer was good and photo resist remaining unstripped in the photo resist layer removing step was not observed. Furthermore, the rectangularity of the colored layer pattern was good or within practically permitted limit.

As described so far, in the color filter manufacturing method of the present invention, a stopper layer is formed on a support, and in the first etching step, dry etching treatment is carried out using a first mixed gas, which contains fluorine-based gas and oxygen gas, to remove part of the colored layer and form a colored layer removed portion and in the second etching step, dry etching treatment is carried out using a second mixed gas, which contains nitrogen gas and oxygen gas, to remove the colored layer removed portion; thus, the method makes it possible to retard the occurrence of support damage attributed to dry etching treatment.

Furthermore, since the etching rate of the stopper layer by the second mixed gas is low, the stopper layer is etched only a little, whereby damage is not caused to the support located under the stopper layer.

The dry etching process of the present invention which uses mixed gases makes it possible to retard the deposition, on the photo resist, of the side wall protecting film produced by etching, thereby making easy the stripping of the photo resist layer remaining after the dry etching treatment. Furthermore, since the colored layer is removed by dry etching treatment, a rectangular pattern can be formed while maintaining the anisotropy of the pattern. Thus, the use of the color filter manufacturing method of the present invention makes it possible to retard the occurrence of support damage and to fabricate a color filter having so high a pattern rectangularity, and therefore, the method of the present invention is very useful.

The color filter fabricated by the manufacturing method of the present invention can be used in liquid crystal display devices or solid-state image sensors such as CCDs and is particularly suitable for high-resolution CCD devices or CMOS with more than one million pixels. The color filter of the present invention can be used as a color filter disposed between the photo-detecting portion of each pixel and a microlense for light collection which constitute a CCD.

What is claimed is:

1. A method of manufacturing color filters using a first mixed gas, which contains a fluorine-based gas and oxygen gas, and a second mixed gas, which contains nitrogen gas and oxygen gas, comprising:

a stopper layer forming step of forming, on a support, a stopper layer whose etching rate by the second mixed gas is low;

a colored layer forming step of forming a colored layer on the stopper layer;

a photo resist layer forming step of forming a photo resist layer on the colored layer;

an image forming step of forming an image on the colored layer by removing the photo resist layer according to a pattern;

a first etching step of removing, by dry etching process using the first mixed gas, a part of the colored layer to the extent that the stopper layer is not exposed so as to form a colored-layer removed portion according to the pattern formed in the image forming step;

a second etching step of removing, after the first etching step, the colored-layer removed portion by dry etching process using the second mixed gas so as to form a stopper-layer exposed portion according to the pattern; and a photo resist layer removing step of removing the photo resist layer remaining after the second etching step.

2. The method of manufacturing color filters according to claim 1, wherein
the stopper layer contains any one metal selected from the group consisting of Si, Ti, Al, Zr, Ta and Ce and is transparent in the visible light area.

3. The method of manufacturing color filters according to claim 2, wherein
the stopper layer has a thickness of 5 nm to 200 nm.

4. The method of manufacturing color filters according to claim 2, wherein
the second mixed gas selectivity of the stopper layer to colored layer is 5 or more.

5. The method of manufacturing color filters according to claim 2, wherein
the second etching step further comprises an over-etching treatment sub-step.

6. The method of manufacturing color filters according to claim 2, wherein
the fluorine-based gas is at least one kind of fluorine-based gas selected from the group consisting of $CF_4$, $C_4F_8$, $C_2F_6$ and $CHF_3$.

7. The method of manufacturing color filters according to claim 2, wherein
the first mixed gas further contains at least one kind of gas selected from the group consisting of Ar, He, Kr, $N_2$ and Xe, and the content of at least one kind of gas selected from the group consisting of Ar, He, Kr, $N_2$ and Xe in the first mixed gas is 25 or less, on the basis of flow rate ratio, when it is assumed that the flow rate of oxygen gas is 1.

8. The method of manufacturing color filters according to claim 2, wherein
the second mixed gas further contains at least one kind of gas selected from the group consisting of Ar, He, Kr and Xe, and the content of at least one kind of gas selected from the group consisting of Ar, He, Kr and Xe in the second mixed gas is 25 or less, on the basis of flow rate ratio, when it is assumed that the flow rate of oxygen gas is 1.

9. The method of manufacturing color filters according to claim 2, wherein
in the first etching step, the internal pressure of a chamber is 2.0 to 6.0 Pa.

10. The method of manufacturing color filters according to claim 2, wherein
in the second etching step, the internal pressure of a chamber is 1.0 to 4.0 Pa.

11. The method of manufacturing color filters according to claim 2, wherein
in the first and/or second etching steps, the temperature of the support is 30° C. to 100° C.

12. The method of manufacturing color filters according to claim 1, wherein
the stopper layer has a thickness of 5 nm to 200 nm.

13. The method of manufacturing color filters according to claim 1, wherein
the second mixed gas selectivity of the stopper layer to colored layer is 5 or more.

14. The method of manufacturing color filters according to claim 1, wherein
the second etching step further comprises an over-etching treatment sub-step.

15. The method of manufacturing color filters according to claim 1, wherein
the fluorine-based gas is at least one kind of fluorine-based gas selected from the group consisting of $CF_4$, $C_4F_8$, $C_2F_6$ and $CHF_3$.

16. The method of manufacturing color filters according to claim 1, wherein
the first mixed gas further contains at least one kind of gas selected from the group consisting of Ar, He, Kr, $N_2$ and Xe, and the content of at least one kind of gas selected from the group consisting of Ar, He, Kr, $N_2$ and Xe in the first mixed gas is 25 or less, on the basis of flow rate ratio, when it is assumed that the flow rate of oxygen gas is 1.

17. The method of manufacturing color filters according to claim 1, wherein
the second mixed gas further contains at least one kind of gas selected from the group consisting of Ar, He, Kr and Xe, and the content of at least one kind of gas selected from the group consisting of Ar, He, Kr and Xe in the second mixed gas is 25 or less, on the basis of flow rate ratio, when it is assumed that the flow rate of oxygen gas is 1.

18. The method of manufacturing color filters according to claim 1, wherein
in the first etching step, the internal pressure of a chamber is 2.0 to 6.0 Pa.

19. The method of manufacturing color filters according to claim 1, wherein
in the second etching step, the internal pressure of a chamber is 1.0 to 4.0 Pa.

20. The method of manufacturing color filters according to claim 1, wherein
in the first and/or second etching steps, the temperature of the support is 30° C. to 100° C.

* * * * *